US012074197B2

(12) United States Patent
Wang

(10) Patent No.: US 12,074,197 B2
(45) Date of Patent: Aug. 27, 2024

(54) SELF-BALANCING SUPER JUNCTION STRUCTURE AND PREPARATION METHOD THEREOF

(71) Applicant: CHINA RESOURCES MICROELECTRONICS (CHONGQING) CO. LTD., Chongqing (CN)

(72) Inventor: Daili Wang, Chongqing (CN)

(73) Assignee: CHINA RESOURCES MICROELECTRONICS (CHONGQING) CO. LTD., Chongqing (CN)

( * ) Notice: Subject to any disclaimer, the term of this patent is extended or adjusted under 35 U.S.C. 154(b) by 362 days.

(21) Appl. No.: 17/624,337

(22) PCT Filed: Dec. 31, 2019

(86) PCT No.: PCT/CN2019/130473
§ 371 (c)(1),
(2) Date: Dec. 31, 2021

(87) PCT Pub. No.: WO2021/042643
PCT Pub. Date: Mar. 11, 2021

(65) Prior Publication Data
US 2022/0262897 A1  Aug. 18, 2022

(30) Foreign Application Priority Data
Sep. 3, 2019 (CN) .......................... 201910827448.3

(51) Int. Cl.
*H01L 21/225* (2006.01)
*H01L 21/265* (2006.01)
(Continued)

(52) U.S. Cl.
CPC ...... *H01L 29/0634* (2013.01); *H01L 21/2253* (2013.01); *H01L 21/26586* (2013.01); *H01L 29/66477* (2013.01); *H01L 29/78* (2013.01)

(58) Field of Classification Search
CPC ......... H01L 29/06; H01L 29/15; H01L 29/16; H01L 29/418; H01L 29/66; H01L 29/78;
(Continued)

(56) References Cited

U.S. PATENT DOCUMENTS

2016/0322490 A1* 11/2016 Hirler .................. H01L 29/0634
2017/0358452 A1* 12/2017 Rupp ................. H01L 21/26506
(Continued)

FOREIGN PATENT DOCUMENTS

| CN | 101258587 A | 9/2008 |
| CN | 103021863 A | 4/2013 |
| EP | 3422418 A1 | 1/2019 |

*Primary Examiner* — Chuong A Luu
(74) *Attorney, Agent, or Firm* — Global IP Services; Tianhua Gu

(57) ABSTRACT

A self-balancing super junction structure and a preparation method thereof. The method includes: forming an initial epitaxial layer on a surface of a substrate of a first doping type; respectively forming an implantation region of the first doping type and an implantation region of a second doping type in the initial epitaxial layer; forming an intrinsic epitaxial layer on the surface of the initial epitaxial layer; respectively forming an implantation region of the first doping type and an implantation region of the second doping type in the intrinsic epitaxial layer; and repeating the steps to form a structure with stacked epitaxial layers, and then performing thermal diffusion treatment to form a self-balancing super junction structure. Ions of the first doping type and ions of the second doping type in a same layer of the epitaxial layer stack structure are implanted after a same lithography step.

10 Claims, 5 Drawing Sheets

(51) Int. Cl.
*H01L 29/06* (2006.01)
*H01L 29/66* (2006.01)
*H01L 29/78* (2006.01)

(58) Field of Classification Search
CPC . H01L 29/157; H01L 29/158; H01L 29/0634; H01L 29/66477; H01L 29/7811; H01L 29/0623; H01L 29/66712; H01L 29/1095; H01L 21/225; H01L 21/265; H01L 21/266; H01L 21/2253; H01L 21/26586; H01L 21/768; H01L 21/76802; H01L 21/3115; H01L 21/31155
USPC .................................. 438/259, 270, 271, 589
See application file for complete search history.

(56) References Cited

U.S. PATENT DOCUMENTS

2018/0006147 A1   1/2018  Weber
2018/0061979 A1*  3/2018  Weber ..................... H01L 21/78

* cited by examiner

```
┌─────────────────────────────────────────────────────────────┐
│ Provide a substrate of a first doping type, wherein the     │
│ substrate of the first doping type has a first surface and  │──S1
│ a second surface opposite to each other, and form an        │
│ initial epitaxial layer on the first surface of the         │
│ substrate of the first doping type                          │
└─────────────────────────────────────────────────────────────┘
                              ↓
┌─────────────────────────────────────────────────────────────┐
│ Form a barrier layer having an implantation window on a     │
│ surface of the initial epitaxial layer, and respectively    │
│ form an implantation region of the first doping type and an │──S2
│ implantation region of a second doping type in the initial  │
│ epitaxial layer through the implantation window by ion      │
│ implantation                                                │
└─────────────────────────────────────────────────────────────┘
                              ↓
┌─────────────────────────────────────────────────────────────┐
│ Remove the barrier layer, and form an intrinsic epitaxial   │──S3
│ layer on the surface of the initial epitaxial layer         │
└─────────────────────────────────────────────────────────────┘
                              ↓
┌─────────────────────────────────────────────────────────────┐
│ Form a barrier layer having an implantation window on a     │
│ surface of the intrinsic epitaxial layer, and respectively  │
│ form an implantation region of the first doping type and an │──S4
│ implantation region of the second doping type in the        │
│ intrinsic epitaxial layer through the implantation window   │
│ by ion implantation                                         │
└─────────────────────────────────────────────────────────────┘
                              ↓
┌─────────────────────────────────────────────────────────────┐
│ Repeat step 3) and step 4) to form a structure with stacked │
│ epitaxial layers having a plurality of implantation regions │
│ of the first doping type and a plurality of implantation    │──S5
│ regions of the second doping type, wherein the plurality of │
│ implantation regions of the first doping type are aligned   │
│ with each other in a vertical direction, and the plurality  │
│ of implantation regions of the second doping type are       │
│ aligned with each other in a vertical direction             │
└─────────────────────────────────────────────────────────────┘
                              ↓
┌─────────────────────────────────────────────────────────────┐
│ Diffuse and connect the implantation regions of the first   │
│ doping type to form columns of the first doping type, and   │
│ diffuse and connect the implantation regions of the second  │──S6
│ doping type to form columns of the second doping type,      │
│ wherein the columns of the second doping type are spaced    │
│ apart by the columns of the first doping type to form a     │
│ self-balancing super junction structure                     │
└─────────────────────────────────────────────────────────────┘
```

Fig. 1

SELF-BALANCING SUPER JUNCTION STRUCTURE AND PREPARATION METHOD THEREOF

CROSS REFERENCE TO RELATED PATENT APPLICATION

The present application is the US national stage of PCT/CN2019/130473 filed on 2019 Dec. 31, which claims the priority of the Chinese patent application No. 201910827448.3 filed on 2019 Sep. 3, which application is incorporated herein by reference.

FIELD OF TECHNOLOGY

The present disclosure relates to the technical field of semiconductor structures, and in particular, to a self-balancing super junction structure and a preparation method therefor.

BACKGROUND

A super junction structure adopts an alternating PN junction structure instead of single conductive material as its drift region, introducing a transverse electric field in the drift region, making the drift region completely depleted at a small turn-off voltage, and as a result its breakdown voltage is only related to the depletion layer's thickness and the critical electric field. Therefore, the doping concentration in the drift region of the super junction structure can be increased by an order of magnitude under the same withstand voltage condition, which greatly reduces the on-state resistance.

Charge balance between the P region and N region is the key to achieving a higher breakdown voltage of the super junction structure. When charges in the P region and the N region are in balance, the super junction structure can have a higher breakdown voltage. When the charges in the P region and the N region are out of balance, the breakdown voltage decreases rapidly.

At present, a super junction structure is mainly prepared by two methods. One method is performing deep trench etching and then epitaxial filling. Specifically, an N-type (or a P-type) epitaxial layer is formed on a substrate, and a trench is formed in the N-type (or the P-type) epitaxial layer, and then a P-type (or an N-type) filling layer is formed in the trench to obtain a super junction structure. However, in order to achieve charge balance between the P region and the N region, in the above method for preparing the super junction structure, key parameters such as the concentration of the N-type (or the P-type) epitaxial layer, the etching width of the trench, and the concentration of the P-type (or the N-type) filling layer need to be strictly controlled and to match each other. However, strict control of the above key parameters results in a higher process difficulty and lower process compatibility, causing relatively large parameter fluctuations of final products. The other method is performing epitaxy, implantation, and annealing a plurality of times. However, in order to achieve charge balance, in this method, implantation regions of one or two of P/N impurities need to be defined by a lithography process. Line width fluctuation of the lithography process greatly affects the charge balance. In addition, as a result of many factors, precise line width control of the lithography process cannot be realistically achieved. Also, the conventional multilayer epitaxial structure super junction process has strict requirements for control of the lithography process, resulting in a high process difficulty and low process compatibility, thus causing relatively large parameter fluctuations of the final products.

SUMMARY

The present disclosure provides a method for preparing a self-balancing super junction structure. The method includes at least steps of:
1) providing a substrate of a first doping type, wherein the substrate of the first doping type has a first surface and a second surface opposite to each other, and forming an initial epitaxial layer on the first surface of the substrate of the first doping type;
2) forming a barrier layer on a surface of the initial epitaxial layer, wherein the barrier layer has an implantation window, and respectively forming an implantation region of the first doping type and an implantation region of a second doping type in the initial epitaxial layer through the implantation window by using an ion implantation process, wherein the polarity of ions in the implantation region of the first doping type is opposite to the polarity of ions in the implantation region of the second doping type;
3) removing the barrier layer, and forming an intrinsic epitaxial layer on the surface of the initial epitaxial layer;
4) forming a barrier layer with an implantation window on a surface of the intrinsic epitaxial layer, and respectively forming an implantation region of the first doping type and an implantation region of the second doping type in the intrinsic epitaxial layer through the implantation window by using an ion implantation process, wherein the polarity of ions in the implantation region of the first doping type is opposite to the polarity of ions in the implantation region of the second doping type;
5) repeating step 3) and step 4) to form a structure with stacked epitaxial layers that has a plurality of implantation regions of the first doping type and a plurality of implantation regions of the second doping type in different epitaxial layers, wherein the plurality of implantation regions of the first doping type are aligned with each other in a vertical direction, and the plurality of implantation regions of the second doping type are aligned with each other in a vertical direction; and
6) diffusing and connecting the implantation regions of the first doping type to form columns of the first doping type, and diffusing and connecting the implantation regions of the second doping type to form columns of the second doping type, wherein the columns of the second doping type are spaced apart by the columns of the first doping type to form a self-balancing super junction structure, wherein a total quantity of ions of the first doping type of the columns of the first doping type substantially equals a total quantity of ions of the second doping type of the columns of the second doping type.

When the first doping type is the N type, the second doping type is the P type, or when the first doping type is the P type, the second doping type is the N type.

The present disclosure further provides a self-balancing super junction structure. The self-balancing super junction structure is prepared by the following method:
1) providing a substrate of a first doping type, wherein the substrate of the first doping type has a first surface and a second surface opposite to each other, and forming an initial epitaxial layer on the first surface of the substrate of the first doping type;

2) forming a barrier layer with an implantation window on a surface of the initial epitaxial layer, and respectively forming an implantation region of the first doping type and an implantation region of a second doping type in the initial epitaxial layer through the implantation window by using an ion implantation process;

3) removing the barrier layer, and forming an intrinsic epitaxial layer on the surface of the initial epitaxial layer;

4) forming a barrier layer with an implantation window on a surface of the intrinsic epitaxial layer, and respectively forming an implantation region of the first doping type and an implantation region of the second doping type in the intrinsic epitaxial layer through the implantation window by using the ion implantation process;

5) repeating step 3) and step 4) to form a structure with stacked epitaxial layers having a plurality of implantation regions of the first doping type and a plurality of implantation regions of the second doping type, wherein the plurality of implantation regions of the first doping type are aligned with each other in a vertical direction, and the plurality of implantation regions of the second doping type are aligned with each other in a vertical direction; and 6) diffusing and connecting the implantation regions of the first doping type to form columns of the first doping type, and diffusing and connecting the implantation regions of the second doping type to form columns of the second doping type, wherein the columns of the second doping type are spaced apart by the columns of the first doping type to form a self-balancing super junction structure.

A total quantity of ions of the first doping type of the columns of the first doping type equals a total quantity of ions of the second doping type of the columns of the second doping type.

When the first doping type is of the N type, the second doping type is of the P type, or when the first doping type is of the P type, the second doping type is of the N type.

In the above method for preparing a self-balancing super junction structure of the present disclosure, the epitaxy process and the ion implantation are repeatedly performed to form a structure with stacked epitaxial layers, and the ions of the first doping type and the ions of the second doping type in a same layer of the epitaxial layer stack structure are implanted after a same lithography step, that is, the charge balance between the two types of ions in each layer depends on the implantation. Therefore, the total quantity of the ions of the first doping type and the total quantity of the ions of the second doping type in the structure depend solely on the implantation, and adjustment of the lithography line width does not affect the balance between the two types of ions, thereby greatly reducing the influence of the lithography line width on the implantation amounts of the two types of ions, significantly lowering the requirements on the lithography line width, reducing the difficulty of the lithography process, and increasing the process tolerance.

BRIEF DESCRIPTION OF THE DRAWINGS

FIG. 1 is a flowchart showing a method for preparing a self-balancing super junction structure according to the present disclosure.

DETAILED DESCRIPTION

Figure 2:
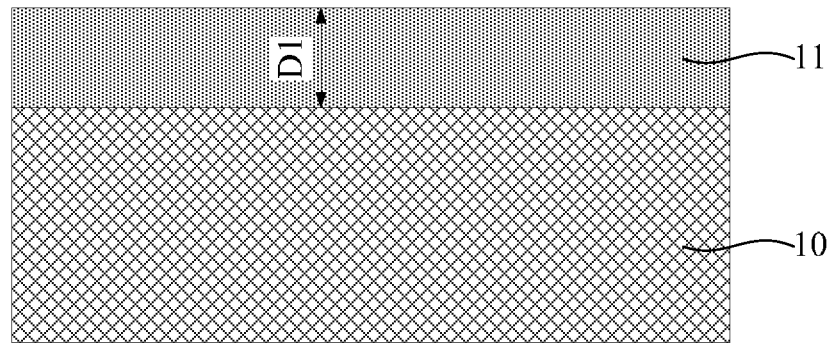
FIGS. 2 to 10 are schematic structural diagrams corresponding to steps in the method for preparing a self-balancing super junction structure according to the present disclosure.

Refer to FIGS. 1 to 10, the drawings provided in this disclosure merely exemplify the basic idea of the present disclosure. Therefore, only the components related to the present disclosure are shown in the drawings, and are not necessarily drawn according to the quantities, shapes, and sizes of the components during actual implementation. During actual implementation, the types, quantities, and proportions of the components may be changed as needed, and the layout of the components may be more complicated.

As shown in FIGS. 1 to 10, the present disclosure provides a method for preparing a self-balancing super junction structure. The method includes at least the steps described below.

Referring to step S1 in FIG. 1, and FIG. 2. Step S1 is performed first, in which a substrate 10 of a first doping type is provided, wherein the substrate 10 of the first doping type has a first surface and a second surface opposite to each other, and an initial epitaxial layer 11 is formed on the first surface of the substrate 10 of the first doping type.

As an example, the substrate 10 of the first doping type may be, a silicon substrate doped with ions of the first doping type. The substrate 10 of the first doping type may be a substrate formed by implanting the ions of the first doping type into a substrate by using an ion implantation process.

As an example, the substrate 10 of the first doping type is a heavily doped substrate. Preferably, a doping concentration of the substrate 10 of the first doping type is greater than $1 \times e^{19}/cm^3$.

As an example, the initial epitaxial layer 11 is an epitaxial layer of the first doping type. In an example, an intrinsic epitaxial layer may be first formed on an upper surface of the substrate 10 of the first doping type by using an epitaxy process, and then the ions of the first doping type are implanted into the intrinsic epitaxial layer by using the ion implantation process to form the initial epitaxial layer 11. In another example, the initial epitaxial layer 11 may be directly epitaxially formed on the upper surface of the substrate 10 of the first doping type by using an epitaxy process.

As an example, a thickness D1 of the initial epitaxial layer is within the range of 2 μm to 20 μm. For example, the thickness may be 6 μm, 10 μm, 14 μm, or 18 μm. The specific thickness and ion implantation concentration depend on the process design. When the thickness D1 of the initial epitaxial layer is less than 2 μm, a withstand voltage of the final super junction structure will be relatively low. When the thickness D1 of the initial epitaxial layer is greater than 20 μm, an on resistance of the final super junction structure will be relatively high.

Referring to step S2 in FIG. 1, and FIGS. 3-5. Step S2 is then performed, in which a barrier layer 12 with an implantation window 120 is formed on a surface of the initial epitaxial layer 11, and an implantation region 13 of the first doping type and an implantation region 14 of a second doping type are respectively formed in the initial epitaxial layer 11 through the implantation window 120 by using the ion implantation process. The polarity of ions in the implantation region 13 of the first doping type is opposite to the polarity of ions in the implantation region 14 of the second doping type.

Figure 4:
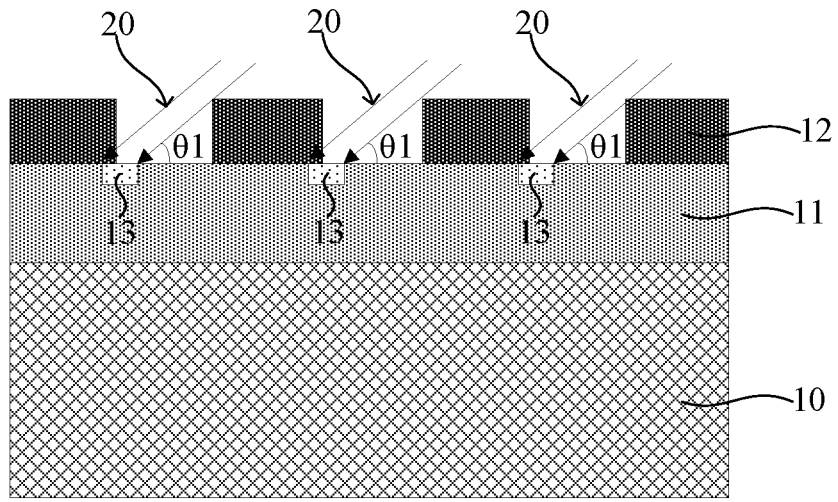
Figure 5:
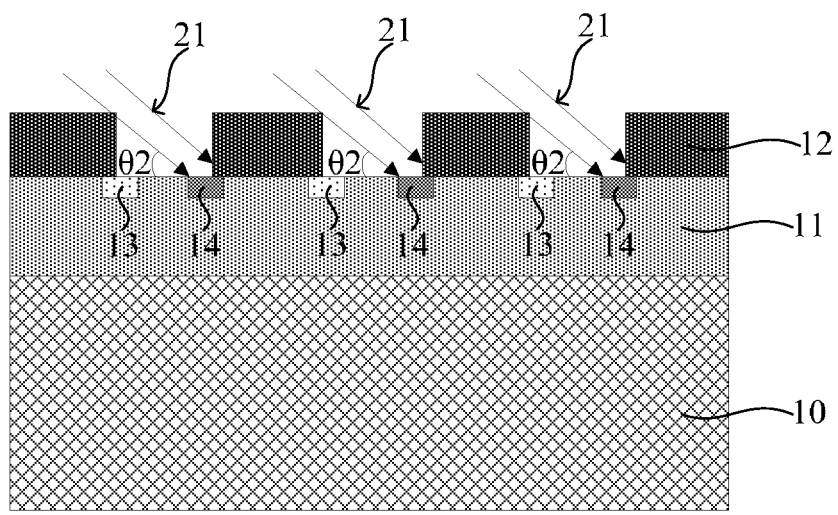

Arrows in FIG. 4 and FIG. 5 represent ion implantation directions. The formed implantation region 13 of the first doping type and implantation region 14 of the second doping type may be spaced apart by a preset distance or partially overlap. The preset distance and the overlapping distance herein depend on the specific process design.

As an example, the implantation region 13 of the first doping type and the implantation region 14 of the second doping type are formed by the following steps.

2-1): Form the barrier layer 12 (not shown in the figure) on the upper surface of the initial epitaxial layer 11.

Figure 3:
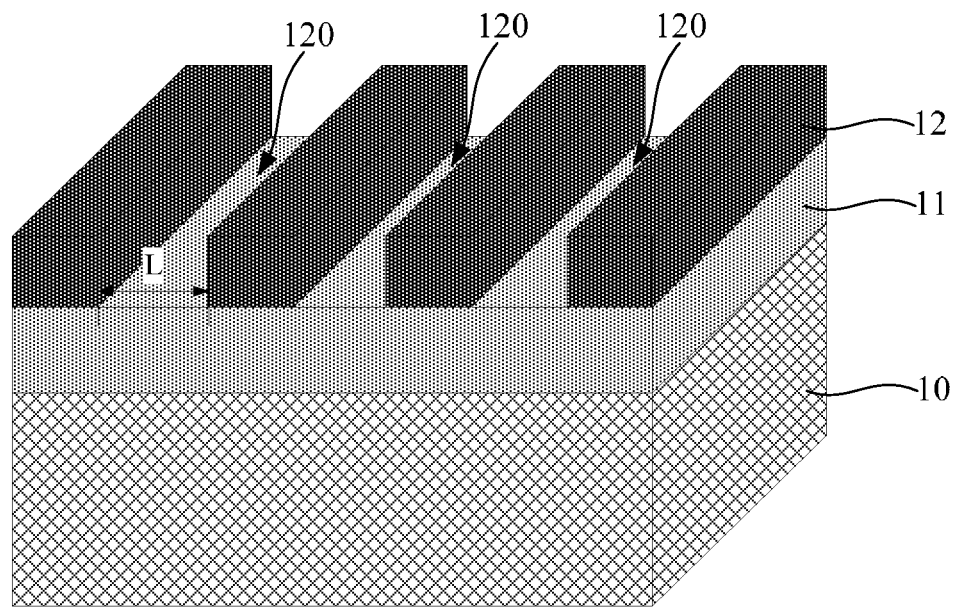

2-2): Etch the barrier layer 12 by lithography to form the implantation window 120 in the barrier layer 12, wherein the implantation window 120 defines a shape and a position for a follow-up ion implantation process, and preferably, the barrier layer 12 is etched into strips by lithography, as shown in FIG. 3.

2-3): Form the implantation region 13 of the first doping type in the initial epitaxial layer 11 through the implantation window 120 by ion implantation, as shown in FIG. 4.

2-4): Form the implantation region 14 of the second doping type in the initial epitaxial layer 11 through the implantation window 120 by ion implantation, as shown in FIG. 5.

Step 2-3) and step 2-4) may be transposed. That is to say, after step 2-2) is finished, step 2-4) may be first performed, and then step 2-3) is performed.

As shown in FIG. 4 and FIG. 5, as an example, tilted ion implantation is adopted to form the implantation region 13 of the first doping type and the implantation region 14 of the second doping type. The direction of a first ion implantation beam 20 used for forming the implantation region 13 of the first doping type is in an "opposite tilt relationship" with the direction of a second ion implantation beam 21 used for forming the implantation region 14 of the second doping type, and projections of the first ion implantation beam 20 and the second ion implantation beam 21 on the surface of the initial epitaxial layer 11 are perpendicular to the length direction of the strips of the barrier layer 12. Preferably, the included angle 81 of the first ion implantation beam 20 and the initial epitaxial layer 11 equals the included angle 82 of the second ion implantation beam 21 and the initial epitaxial layer 11, and 81 and 82 are within the range of 3° to 60°.

The above opposite tilt relationship may be understood as follows. In FIG. 4 and FIG. 5, if directions from a left side to a right side of the initial epitaxial layer 11 are defined as positive directions, then the direction of the first ion implantation beam 20 is a positive tilt direction, and the direction of the second ion beam 21 is a negative tilt direction. Alternatively, in FIG. 4 and FIG. 5, if directions from the right side to the left side of the initial epitaxial layer 11 are defined as positive directions, then the direction of the first ion implantation beam 20 is the negative tilt direction, and the direction of the second ion beam 21 is the positive tilt direction. Therefore, regardless of which side of the initial epitaxial layer 11 defines the positive directions, the direction of the first ion implantation beam 20 and the direction of the second ion implantation beam 21 are in the opposite tilt relationship.

As an example, a width L of the implantation window is within the range of 1 μm to 10 μm. For example, the width may be 3 μm, 5 μm, or 7 μm.

As an example, an implantation dose of the ions of the first doping type in the implantation region 13 of the first doping type is within the range of $1 \times e^{12}/cm^2$ to $1 \times e^{14}/cm^2$, and an implantation dose of the ions of the second doping type in the implantation region 14 of the second doping type is within the range of $1 \times e^{12}/cm^2$ to $1 \times e^{14}/cm^2$.

Figure 6:
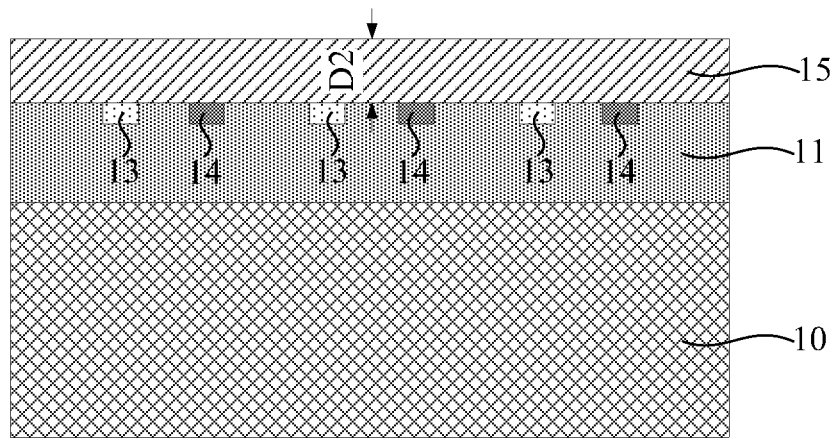

Refer to step S3 in FIG. 1 and FIG. 6. Step S3 is then performed, in which the barrier layer 12 is removed, and an intrinsic epitaxial layer 15 is formed on the surface of the initial epitaxial layer 11.

As an example, a thickness of the intrinsic epitaxial layer 15 is within the range of 2 μm to 12 μm. For example, the thickness may be 6 μm, 8 μm, or 10 μm. The specific thickness depends on the process design.

Figure 7:
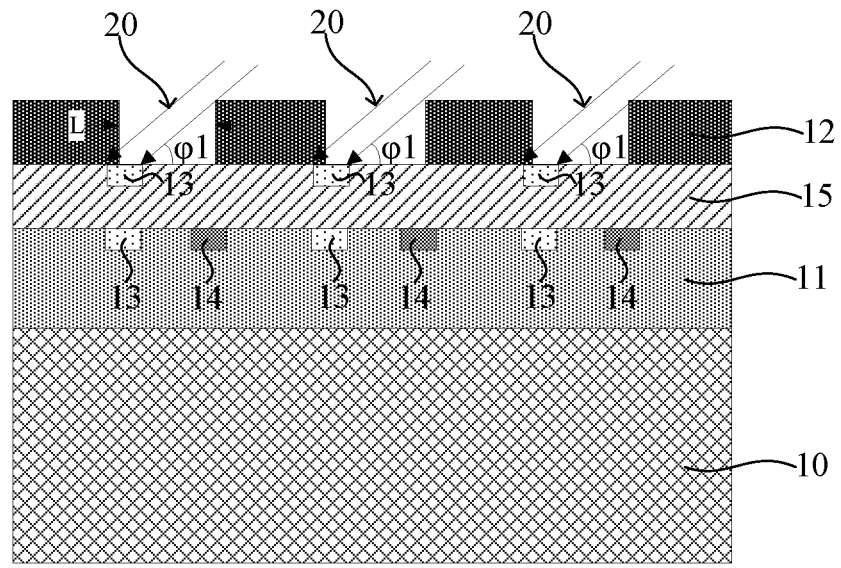
Figure 8:
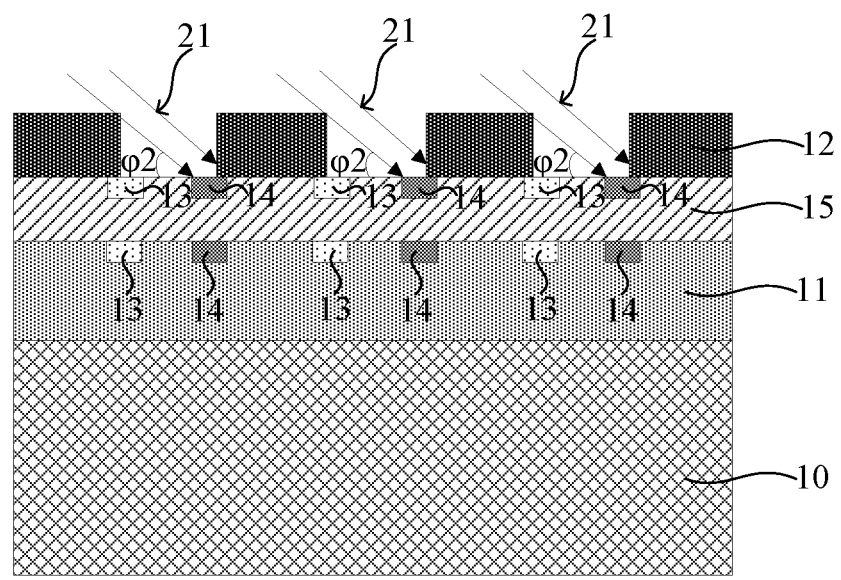

Referring to step S4 in FIG. 1 and FIG. 7 to FIG. 8. Step S4 is then performed, in which another barrier layer 12 having an implantation window 120 is formed on a surface of the intrinsic epitaxial layer 15, and an implantation region 13 of the first doping type and an implantation region 14 of a second doping type are respectively formed in the intrinsic epitaxial layer 15 through the implantation window 120 by ion implantation. The polarity of ions in the implantation region 13 of the first doping type is opposite to the polarity of ions in the implantation region 14 of the second doping type.

Arrows in FIG. 7 and FIG. 8 represent ion implantation directions. The implantation region 13 of the first doping type and implantation region 14 of the second doping type may be spaced apart by a preset distance or partially overlap. The preset distance and overlapping distance herein depend on the specific process design.

As an example, the implantation region 13 of the first doping type and the implantation region 14 of the second doping type are formed by the following steps.

4-1): Form the barrier layer 12 (not shown in the figure) on an upper surface of the intrinsic epitaxial layer 15.

4-2): Etch the barrier layer 12 by lithography to form the implantation window 120 in the barrier layer 12, wherein the implantation window 120 defines a shape and a position for a follow-up ion implantation process, and preferably, the barrier layer 12 is etched into strips by lithography.

4-3): Form the implantation region 13 of the first doping type in the intrinsic epitaxial layer 15 through the implantation window 120 by ion implantation, as shown in FIG. 7.

4-4): Form the implantation region 14 of the second doping type in the intrinsic epitaxial layer 15 through the implantation window 120 by using the ion implantation process, as shown in FIG. 8.

Step 4-3) and step 4-4) may be transposed. That is to say, after step 4-2) is finished, step 4-4) may be first performed, and then step 4-3) is performed.

As shown in FIG. 7 and FIG. 8, as an example, tilted ion implantation is used to form the implantation region 13 of the first doping type and the implantation region 14 of the second doping type. The direction of a first ion implantation beam 20 used for forming the implantation region 13 of the first doping type is in an "opposite tilt relationship" with the direction of a second ion implantation beam 21 used for forming the implantation region 14 of the second doping type, and projections of the first ion implantation beam 20 and the second ion implantation beam 21 on the surface of the initial epitaxial layer 11 are perpendicular to the length direction of strips of the barrier layer 12. Preferably, an included angle $\varphi 1$ of the first ion implantation beam 20 and the intrinsic epitaxial layer 15 equals an included angle $\varphi 2$ of the second ion implantation beam 21 and the intrinsic epitaxial layer 15, and $\varphi 1$ and $\varphi 2$ are within the range of 3° to 60°.

The above opposite tilt relationship may be understood as follows. In FIG. 7 and FIG. 8, if directions from a left side to a right side of the intrinsic epitaxial layer 15 are defined as positive directions, then the direction of the first ion implantation beam 20 is a positive tilt direction, and the direction of the second ion beam 21 is a negative tilt direction. Alternatively, in FIG. 7 and FIG. 8, if directions from the right side to the left side of the intrinsic epitaxial layer 15 are defined as positive directions, then the direction of the first ion implantation beam 20 is the negative tilt direction, and the direction of the second ion beam 21 is the positive tilt direction. Therefore, regardless of which side of the intrinsic epitaxial layer 15 defines the positive directions, the direction of the first ion implantation beam 20 and the direction of the second ion implantation beam 21 are in the opposite tilt relationship.

As an example, a width L of the implantation window is within the range of 1 μm to 10 μm. For example, the width may be 3 μm, 5 μm, or 7 μm.

As an example, an implantation dose of the ions of the first doping type in the implantation region 13 of the first doping type is within the range of $1 \times e^{12}/cm^2$ to $1 \times e^{14}/cm^2$, and an implantation dose of the ions of the second doping type in the implantation region 14 of the second doping type is within the range of $1 \times e^{12}/cm^2$ to $1 \times e^{14}/cm^2$.

Figure 9:
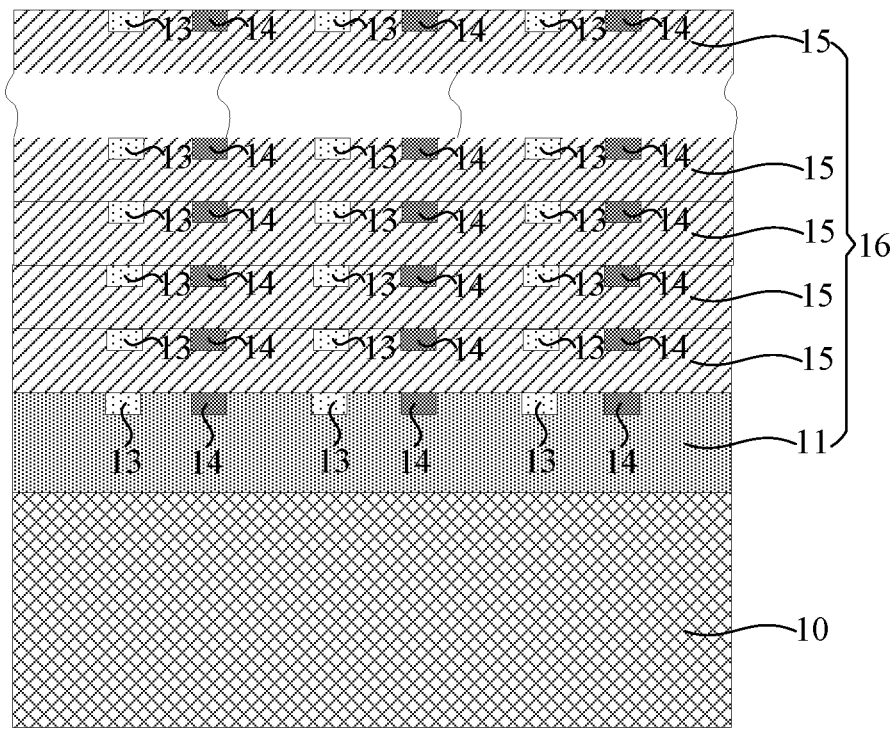

Referring to step S5 in FIG. 1, and FIG. 9. Step S5 is then performed. Step S3 and step S4 are repeated to form a structure with stacked epitaxial layers 16 (hereinafter, "the structure") having a plurality of implantation regions 13 of the first doping type and a plurality of implantation regions 14 of the second doping type. The plurality of implantation regions 13 of the first doping type are aligned with each other in a vertical direction. The plurality of implantation regions 14 of the second doping type are aligned with each other in a vertical direction. In some embodiments, there are two or more implantation regions 13 of the first doping type two and/or two or more implantation regions 14 of the second doping type in each epitaxial layer.

The ion implantation dose of the implantation region 13 of the first doping type formed in each layer of the structure 16 may be the same or different from the ion implantation dose of the implantation regions 14 of the second doping type, as long as the total ion implantation dose of the plurality of implantation regions 13 of the first doping type in the structure 16 equals the total ion implantation dose of the plurality of implantation regions 14 of the second doping type. In order to facilitate process control, the ion implantation dose of the implantation regions 13 of the first doping type formed in each layer of the structure with stacked epitaxial layers 16 may be set the same as the ion implantation dose of the implantation regions 14 of the second doping type. In one embodiment, the epitaxy process and the ion implantation are repeatedly performed to form the structure 16, and ions of the first doping type and ions of the second doping type in a same layer are implanted after a same lithography process, that is, charge balance between the two types of ions in each layer depends on the implantation. Therefore, the total quantity of the ions of the first doping type and the total quantity of the ions of the second doping type in the structure 16 depend only on the implantation, and adjustment of the lithography line width does not affect the balance between the two types of ions, thereby greatly reducing the influence of the lithography line width on the implantation amounts of the two types of ions, significantly lowering the requirements on the lithography line width, reducing the difficulty of the lithography process, and increasing the process tolerance.

As an example, a thicknesses D2 of the intrinsic epitaxial layers 15 in the structure 16 may be the same or different, which depends on the process design requirements.

Figure 10:
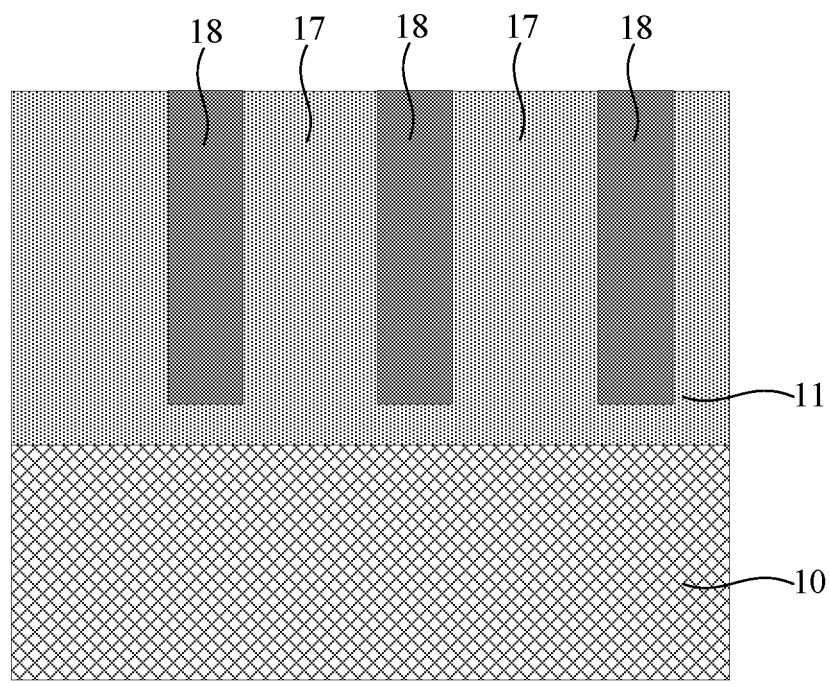

Refer to step S6 in FIG. 1 and FIG. 10. Step S6 is finally performed, in which the implantation regions 13 of the first doping type are diffused and connected to form a column 17 of the first doping type, and the implantation regions 14 of the second doping type are diffused and connected to form a column 18 of the second doping type. In some embodiments, two or more columns 17 and columns 18 are formed, and the columns 18 of the second doping type are spaced apart by the columns 17 of the first doping type to form a self-balancing super junction structure. The total quantity of ions of the first doping type of the columns 17 of the first doping type substantially equals the total quantity of ions of the second doping type of the columns 18 of the second doping type.

During the diffusion and the connection of the implantation regions 13 of the first doping type to form the columns 17 of the first doping type and the diffusion and the connection of the implantation regions 14 of the second doping type to form the columns 18 of the second doping type, the ions may be diffused by a thermal process such as thermal annealing. Alternatively, the ions may have already been diffused and connected during implantation of the ions to form the implantation regions 13 of the first doping type and the implantation regions 14 of the second doping type.

As shown in FIG. 10, as an example, when the initial epitaxial layer 11 is an epitaxial layer of the first doping type, the columns 17 of the first doping type are connected to the initial epitaxial layer 11.

An ion doping concentration of the columns 17 of the first doping type may be the same or different from that of the initial epitaxial layer 11. A thermal diffusion condition may be adjusted according to the specific device process design requirements.

As an example, an average concentration of the ions of the first doping type of the columns 17 of the first doping type and an average concentration of the ions of the second doping type of the columns 18 of the second doping type are both within the range of $1 \times e^{14}/cm^2$ to $1 \times e^{16}/cm^2$.

As an example, in one embodiment, the first doping type is the N type, and the second doping type is the P type; or the first doping type is the P type, and the second doping type is the N type. An N-type doped ion may selectively be an ion of a group-V element, such as phosphorus (P), arsenic (As), or antimony (Sb). A P-type doped ion may selectively be an ion of boron (B), or gallium (Ga).

As shown in FIG. 1 to FIG. 10, the present disclosure further provides a self-balancing super junction structure. The self-balancing super junction structure is prepared by the above method for preparing a self-balancing super junction structure.

In addition, the present disclosure further provides a semiconductor device. The semiconductor device includes the self-balancing super junction structure described above.

As an example, a super junction MOSFET structure is formed by conventional MOSFET preparing methods.

As an example, ions of a second heavy doping type may also be implanted on the second surface of the substrate 10 of the first doping type, and by means of Insulated Gate Bipolar Transistor (IGBT) preparing methods, an IGBT comprising a super junction structure is formed.

In addition, other semiconductor devices comprising the self-balancing super junction structure may also be formed.

In summary, in the method for preparing a self-balancing super junction structure, the total quantity of the ions of the first doping type and the total quantity of the ions of the second doping type in the epitaxial layer stack structure depend only on the implantation process, and adjustment of the lithography line width does not affect the balance between the two types of ions, thereby greatly reducing the influence of the lithography line width on the implantation amounts of the two types of ions, significantly lowering the requirements on the lithography line width, reducing the difficulty of the lithography process, and increasing the process tolerance.

The foregoing embodiments merely exemplarily illustrate the principles and effects of the present disclosure, and are not intended to limit the present disclosure. A person skilled in the art can modify or change the foregoing embodiments without departing from the spirit and scope of the present disclosure. Therefore, any equivalent modifications or changes completed by a person of ordinary skill in the art without departing from the spirit and technical concept disclosed in the present disclosure shall fall within the scope of claims of the present disclosure.

What is claimed is:

1. A method for preparing a self-balancing super junction structure, comprising at least the following steps:
    1) providing a substrate of a first doping type, wherein the substrate of the first doping type has a first surface and a second surface opposite to each other, and forming an initial epitaxial layer on the first surface of the substrate of the first doping type;
    2) forming a barrier layer having an implantation window on a surface of the initial epitaxial layer, and respectively forming an implantation region of the first doping type and an implantation region of a second doping type in the initial epitaxial layer through the implantation window by ion implantation;
    3) removing the barrier layer, and forming an intrinsic epitaxial layer on the surface of the initial epitaxial layer;
    4) forming a barrier layer having an implantation window on a surface of the intrinsic epitaxial layer, and respectively forming an implantation region of the first doping type and an implantation region of the second doping type in the intrinsic epitaxial layer through the implantation window by ion implantation;
    5) repeating step 3) and step 4) to form a structure with stacked epitaxial layers having a plurality of implantation regions of the first doping type and a plurality of implantation regions of the second doping type, wherein the plurality of implantation regions of the first doping type are aligned with each other in a vertical direction, and the plurality of implantation regions of the second doping type are aligned with each other in a vertical direction; and
    6) diffusing and connecting the implantation regions of the first doping type to form columns of the first doping type, and diffusing and connecting the implantation regions of the second doping type to form columns of the second doping type, wherein the columns of the second doping type are spaced apart by the columns of the first doping type to form the self-balancing super junction structure;
    wherein a total quantity of ions of the first doping type of the columns of the first doping type equals a total quantity of ions of the second doping type of the columns of the second doping type; and
    wherein when the first doping type is N type, the second doping type is P type, and when the first doping type is P type, the second doping type is N type.

2. The method for preparing the self-balancing super junction structure as in claim 1, wherein in step 2), a tilted ion implantation process is used to form the implantation region of the first doping type and the implantation region of the second doping type in the initial epitaxial layer, wherein a direction of a first ion implantation beam used for forming the implantation region of the first doping type is in an opposite tilt relationship with a direction of a second ion implantation beam used for forming the implantation region of the second doping type, and projections of the first ion implantation beam and the second ion implantation beam on the surface of the initial epitaxial layer are perpendicular to the barrier layer; and in step 4), tilted ion implantation processes are used to form the implantation regions of the first doping type and the implantation regions of the second doping type in the structure with stacked epitaxial layers, wherein a direction of a first ion implantation beam used for forming the implantation regions of the first doping type is in an opposite tilt relationship with a direction of a second ion implantation beam used for forming the implantation regions of the second doping type, and projections of the first ion implantation beam and the second ion implantation beam on the surface of the intrinsic epitaxial layer are perpendicular to the barrier layer.

3. The method for preparing the self-balancing super junction structure as in claim 2, wherein in step 2), an included angle of the first ion implantation beam and the initial epitaxial layer equals an included angle of the second ion implantation beam and the initial epitaxial layer, the included angles are within the range of 3° to 60°, in step 4), an included angle of the first ion implantation beam and the intrinsic epitaxial layer equals an included angle of the second ion implantation beam and the intrinsic epitaxial layer, and the included angles are within the range of 3° to 60°.

4. The method for preparing the self-balancing super junction structure as in claim 1, wherein in step 2), a width of the implantation window is within the range of 1 μm to 10 μm, and in step 4), a width of the implantation window is within the range of 1 μm to 10 μm.

5. The method for preparing the self-balancing super junction structure as in claim 1, wherein in step 1), the initial epitaxial layer is an epitaxial layer of the first doping type.

6. The method for preparing the self-balancing super junction structure as in claim 1, wherein in step 1), the substrate of the first doping type is a heavily doped substrate, and a doping concentration of the substrate of the first doping type is greater than $1\times e^{19}/cm^3$.

7. The method for preparing the self-balancing super junction structure as in claim 1, wherein in step 1), a thickness of the initial epitaxial layer is within the range of 2 μm to 20 μm, and in step 3), a thickness of the intrinsic epitaxial layer is within the range of 2 μm to 12 μm.

8. The method for preparing the self-balancing super junction structure as in claim 1, wherein an implantation dose of the ions of the first doping type in the implantation region of the first doping type is within the range of $1\times e^{12}/cm^2$ to $1\times e^{14}/cm^2$, and an implantation dose of the ions of the second doping type in the implantation region of the second doping type is within the range of $1\times e^{12}/cm^2$ to $1\times e^{14}/cm^2$.

9. The method for preparing the self-balancing super junction structure as in claim 1, further comprising: implanting ions of a second heavy doping type on the second surface of the substrate of the first doping type.

10. A self-balancing super junction structure, prepared by the following method:
    1) providing a substrate of a first doping type, wherein the substrate of the first doping type has a first surface and a second surface opposite to each other, and forming an initial epitaxial layer on the first surface of the substrate of the first doping type;
2) forming a barrier layer having an implantation window on a surface of the initial epitaxial layer, and respectively forming an implantation region of the first doping type and an implantation region of a second doping type in the initial epitaxial layer through the implantation window by ion implantation;
3) removing the barrier layer, and forming an intrinsic epitaxial layer on the surface of the initial epitaxial layer;
4) forming another barrier layer having an implantation window on a surface of the intrinsic epitaxial layer, and respectively forming an implantation region of the first doping type and an implantation region of the second doping type in the intrinsic epitaxial layer through the implantation window by ion implantation;
5) repeating step 3) and step 4) to form a structure with stacked epitaxial layers having a plurality of implantation regions of the first doping type and a plurality of implantation regions of the second doping type, wherein the plurality of implantation regions of the first doping type are aligned with each other in a vertical direction, and the plurality of implantation regions of the second doping type are aligned with each other in a vertical direction; and
6) diffusing and connecting the implantation regions of the first doping type to form columns of the first doping type, and diffusing and connecting the implantation regions of the second doping type to form columns of the second doping type, wherein the columns of the second doping type are spaced apart by the columns of the first doping type to form the self-balancing super junction structure;
wherein a total quantity of ions of the first doping type of the columns of the first doping type equals a total quantity of ions of the second doping type of the columns of the second doping type; and
wherein when the first doping type is N type, the second doping type is P type, and when the first doping type is P type, the second doping type is N type.

* * * * *